(12) United States Patent
Misumi et al.

(10) Patent No.: US 6,641,972 B2
(45) Date of Patent: Nov. 4, 2003

(54) POSITIVE PHOTORESIST COMPOSITION FOR THE FORMATION OF THICK FILMS, PHOTORESIST FILM AND METHOD OF FORMING BUMPS USING THE SAME

(75) Inventors: Kouichi Misumi, Kanagawa (JP); Koji Saito, Kanagawa (JP); Toshiki Okui, Kanagawa (JP); Hiroshi Komano, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 28 days.

(21) Appl. No.: 10/090,170

(22) Filed: Mar. 5, 2002

(65) Prior Publication Data

US 2003/0059706 A1 Mar. 27, 2003

(30) Foreign Application Priority Data

Mar. 6, 2001 (JP) ........................................ 2001-061565

(51) Int. Cl.$^7$ ............................. G03F 7/023; G03F 7/30
(52) U.S. Cl. ...................... 430/192; 430/165; 430/193; 430/326
(58) Field of Search ................................ 430/165, 192, 430/193, 326

(56) References Cited

U.S. PATENT DOCUMENTS

| 5,670,293 A | * | 9/1997 | Naruse et al. ............... 430/165 |
| 5,731,123 A | * | 3/1998 | Kawamura et al. ......... 430/176 |
| 5,958,646 A | * | 9/1999 | Kawamura et al. ......... 430/192 |

FOREIGN PATENT DOCUMENTS

| JP | 10-207057   | 8/1998 |
| JP | 2000-039709 | 2/2000 |
| JP | 2000-066386 | 3/2000 |

* cited by examiner

Primary Examiner—John S. Chu
(74) Attorney, Agent, or Firm—Sughrue Mion, PLLC

(57) ABSTRACT

A positive photoresist composition includes an alkali-soluble novolak resin (A), an alkali-soluble acrylic resin (B) and a quinonediazido-group-containing compound (C) and is used for the formation of a thick film 5 to 100 $\mu$m thick. The ingredient (B) includes 30% to 90% by weight of a unit (b1) derived from a polymerizable compound having an ether bond and 2% to 50% by weight of a unit (b2) derived from a polymerizable compound having a carboxyl group. The composition is applied on a substrate and thereby yields a photoresist film. Likewise, the composition is applied onto a substrate on an electronic part, is patterned, is plated and thereby yields bumps.

6 Claims, No Drawings

POSITIVE PHOTORESIST COMPOSITION FOR THE FORMATION OF THICK FILMS, PHOTORESIST FILM AND METHOD OF FORMING BUMPS USING THE SAME

BACKGROUND OF THE INVENTION

1. Field of the Invention

The present invention relates to a photoresist composition for use in the formation of thick films, as well as to a photoresist film and a method of forming bumps using the photoresist film. Specifically, the invention relates to an alkali-developable positive photoresist composition that is suitable for photofabrication such as bump formation, wiring, interlayer insulating film formation, circuit protective film formation and processing and manufacture of precision parts, carried out when circuit substrates are manufactured and semiconductors and electronic parts are packaged on the circuit substrates.

2. Description of the Related Art

The photofabrication is a generic term for techniques in which a photosensitive resin composition is coated on the surfaces of process articles and the coating films formed are patterned by photolithography, followed by chemical etching or electrolytic etching using the patterns as masks, or electroforming chiefly using electroplating, any of which are applied alone or in combination, to fabricate various precision parts. This is prevalent in the current precision fine processing techniques.

With the downsizing of electronic equipment, there are a rapid progress toward higher integration of LSIs and toward ASIC (application specific integrated circuits), and a demand for multipin thin-film packaging for mounting LSIs on electronic equipment, where the bare chip packaging carried out by the TAB system or flip-chip system has attracted notice. In such multipin packaging, protruded electrodes of 20 μm or more in height, called bumps serving as connecting terminals, must be arranged on the substrate in a high precision, and it has become more required to make the bumps higher in precision so as to be adaptable to any further miniaturization of LSIs in future.

In addition to the formation of the connecting terminals, a rewiring process is performed to form wiring between the chip and the connecting terminals in many cases. In this procedure, the wiring is patterned with the use of a thick resist film about 5 to about 20 μm in thickness.

Photoresists for the formation of thick films are used as materials for the formation of such bumps or for rewiring. The term "photoresist for the formation of thick films" (hereinafter referred to as "thick-film photoresist") used herein means and includes resists that can form films having a thickness of at least about 5 μm on substrates. The thick-film photoresists must satisfy various requirements. For example, they must be capable of forming a film having a thickness of at least 5 μm, must have adhesion to the substrates, must be resistant to plating solutions and have good wettability to the plating solution upon metal plating for the formation of the bumps, must be capable of forming a metallic composition as a result of plating corresponding to the shape of the resist pattern, and must easily be striped with stripping solutions after plating. They also should be resistant to the plating process itself and be resistant to a plurality of plating procedures, since the plating technique becomes more advanced, and a plural plating procedures are repeated in plating process or the plating process is performed under more severe conditions.

No conventional thick-film photoresist compositions satisfy the above requirements. When a thick-film photoresist has poor adhesion to a substrate during development, the resulting patterned resist becomes liable to peel off during development with a reducing size of the pattern. A thick-film photoresist having poor resistance to plating solution induces the deformation or cracking of the patterned resist during immersing in plating solutions or during cleaning. A metallic layer which is formed by plating and does not correspond to the shape of the patterned resist induces bulging.

Japanese Patent Laid-Open Nos. 10-207057, 2000-39709, and 2000-250208 disclose thick-film photoresist compositions for use in the formation of bumps or wiring. However, these thick-film photoresist compositions cause bulging of a metallic layer obtained by plating after development and do not yield satisfactory patterns, as in the conventional equivalents. These compositions also have poor resistance to the plating process itself, cause chipping or cracking of the resist during cleaning operation after plating, and a plurality of plating procedures cannot be repeated using the same patterned resist.

In addition, using the conventional thick-film photoresist compositions, the resulting formed bumps push aside the thick-film photoresist, become bulged and have deteriorated rectangular shapes. The dimensions of the formed bumps are not in exact accordance with those of the mask pattern upon exposure due to the bulging of bumps or the deteriorated dimensional accuracy of the patterned resist. Thus, bumps cannot stably be formed.

SUMMARY OF THE INVENTION

Accordingly, an object of the present invention is to provide a positive photoresist composition that is suitable for the formation of thick films, as well as to provide a photoresist film and a method of forming bumps using the photoresist film. The positive photoresist composition exhibits good adhesion to substrates during development and high resistance to plating solution, can be satisfactorily developed with alkali developing solutions, can satisfactorily be striped from the substrate in unexposed portions, can form a plated metallic layer stably having a rectangular cross section, is highly resistant to plating processes and is suitable as a material for the formation of bumps.

Specifically, the present invention provides, in an aspect, a positive photoresist composition for the formation of a thick film 5 to 100 μm in thickness. The composition includes an alkali-soluble novolak resin (A), an alkali-soluble acrylic resin (B), and a quinonediazido-group-containing compound (C), and the alkali-soluble acrylic resin (B) includes 30% to 90% by weight of a constitutional unit (b1) derived from a polymerizable compound having an ether bond;and 2% to 50% by weight of a constitutional unit (b2) derived from a polymerizable compound having a carboxyl group.

The composition may include 100 parts by weight of the alkali-soluble novolak resin (A), 5 to 50 parts by weight of the alkali-soluble acrylic resin (B), and 5 to 100 parts by weight of the quinonediazido-group-containing compound (C).

The alkali-soluble acrylic resin (B) preferably has a weight average molecular weight of 10000 to 800000.

The quinonediazido-group-containing compound (C) preferably includes a quinonediazidosulfonyl ester of a compound represented by following Formula (1) or (2):

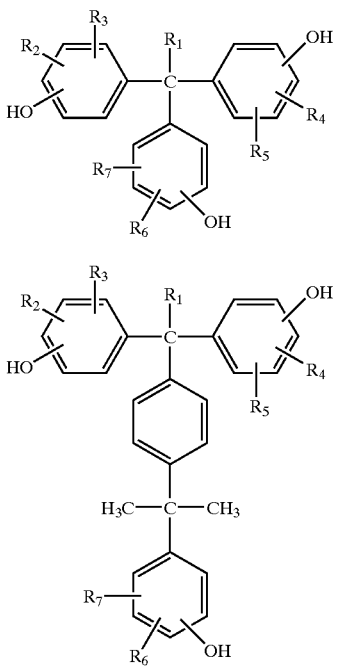

(1)

(2)

wherein $R_1$, $R_2$, $R_3$, $R_4$, $R_5$, $R_6$ and $R_7$ are each independently a hydrogen atom, a substituted or unsubstituted alkyl group having 1 to 5 carbon atoms or a substituted or unsubstituted cycloalkyl group having 4 to 8 carbon atoms.

The present invention provides, in another aspect, a photoresist film being formed on a substrate by the application of the positive photoresist composition and having a thickness of 5 to 100 μm.

In addition and advantageously, the present invention provides a method of forming bumps. The method includes the steps of applying the positive photoresist composition on a substrate of an electronic part to thereby form a resist film as a coating, irradiating the resist film with active light or radiant ray through a mask having a predetermined pattern, developing the exposed resist film, and plating the portions from which the resist film has been removed.

The positive photoresist composition according to the present invention is suitable for the formation of thick films, exhibits good adhesion to substrates during development and high resistance to plating solution, can be satisfactorily developed with an alkali developing solution, can be satisfactorily striped from the substrate in unexposed portions, can form a plated metallic layer stably having a rectangular cross section, is highly resistant to plating process and is suitable as a material for the formation of bumps. The invention also provides photoresist films by the use of the positive photoresist composition and a method of forming bumps using the photoresist films.

DETAILED DESCRIPTION OF THE INVENTION

The present invention will be illustrated in further detail below.

Alkali-soluble Novolak Resins (A)

Alkali-soluble novolak resins for use as the ingredient (A) in the present invention can be obtained, for example, by the addition condensation between aromatic compounds each having a phenolic hydroxyl group (hereinafter simply referred to "phenols") and aldehydes in the presence of acid catalysts. Such phenols for use herein include, but are not limited to, phenol, o-cresol, m-cresol, p-cresol, o-ethylphenol, m-ethylphenyl, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, fluoroglycinol, hydroxydiphenyl, bisphenol A, gallic acid, gallic esters, a-naphthol, and β-naphthol. The aldehydes include, but are not limited to, formaldehyde, paraformaldehyde, furfural, benzaldehyde, nitrobenzaldehyde, and acetaldehyde. Catalysts for use in the addition condensation are not specifically limited and include acid catalysts such as hydrochloric acid, nitric acid, sulfuric acid, formic acid, oxalic acid, and acetic acid.

The weight average molecular weight of the alkali-soluble novolak resin (A) is not specifically limited and is preferably from 10000 to 50000.

Alkali-soluble Acrylic Resins (B)

Alkali-soluble acrylic resins for use as the ingredient (B) in the present invention must comprise 30% to 90% by weight of a constitutional unit (b1) derived from a polymerizable compound having an ether bond, and 2% to 50% by weight of a constitutional unit (b2) derived from a polymerizable compound having a carboxyl group.

Such polymerizable compounds having an ether bond include, but are not limited to, 2-methoxyethyl (meth) acrylate, methoxytriethylene glycol (meth)acrylate, 3-methoxybutyl (meth)acrylate, ethylcarbitol (meth) acrylate, phenoxypolyethylene glycol (meth)acrylate, methoxypolypropylene glycol (meth)acrylate, tetrahydrofurfuryl (meth)acrylate, and other (meth)acrylic acid derivatives each having an ether bond and an ester bond, as well as other radical-polymerizable compounds. Among them, 2-methoxyethyl acrylate and methoxytriethylene glycol acrylate are preferred. Each of these compounds can be used alone or in combination.

The polymerizable compounds having a carboxyl group include, but are not limited to, acrylic acid, methacrylic acid, crotonic acid, and other monocarboxylic acids; maleic acid, fumaric acid, itaconic acid, and other dicarboxylic acids; 2-methacryloyloxyethyl succinate, 2-methacryloyloxyethyl maleate, 2-methacryloyloxyethyl phthalate, 2-methacryloyloxyethyl hexahydrophthalate, and other methacrylic acid derivatives each having a carboxyl group and an ester bond, as well as other radical-polymerizable compounds. Among them, acrylic acid and methacrylic acid are preferred. Each of these compounds can be used alone or in combination.

The content of the polymerizable compound having an ether bond in the alkali-soluble acrylic resin (B) is preferably 30% to 90% by weight, and more preferably 40% to 80% by weight. If the content exceeds 90% by weight, the alkali-soluble acrylic resin may exhibit deteriorated compatibility with the alkali-soluble novolak resin (A), and the resulting composition may cause the formation of Benard convection cells during prebaking and fails to yield uniform resist films. If the content is less than 30% by weight, the resist film may induce cracks during plating operation. The Benard cells are irregular pentagonal, hexagonal or heptagonal network patterns formed on the surface of the resist film due to gradient in gravity or surface tension.

The content of the polymerizable compound having a carboxyl group in the alkali-soluble acrylic resin (B) is preferably 2% to 50% by weight, and more preferably 5% to 40% by weight. If the content is less than 2% by weight, the acrylic resin may have decreased solubility in alkali, the resulting composition may not be satisfactorily developed, may not sufficiently be striped from the substrate and may remain on the substrate. If the content exceeds 50% by weight, the film residual rate after development and resistance to plating may be deteriorated.

The weight average molecular weight of the alkali-soluble acrylic resin (B) is preferably 10000 to 800000, and more preferably 30000 to 500000. If the weight average molecular weight is less than 10000, the resist film may not have sufficient strength to thereby cause a bulged profile of the plated metal or cracking. If it exceeds 800000, the resist film may not satisfactorily striped from the substrate.

The alkali-soluble acrylic resin (B) may further comprise an additional radical-polymerizable compound as a monomer in order to appropriately control the physical and chemical properties of the resulting composition. The term "additional radical-polymerizable compound" as used herein means and includes radical-polymerizable compounds other than the aforementioned polymerizable compounds. Such additional radical-polymerizable compounds include, but are not limited to, methyl (meth)acrylate, ethyl (meth)acrylate, butyl (meth)acrylate, and other alkyl (meth) acrylates; 2-hydroxyethyl (meth)acrylate, 2-hydroxypropyl (meth)acrylate, and other hydroxy-substituted alkyl (meth) acrylates; phenyl (meth)acrylate, benzyl (meth)acrylate, and other aryl (meth)acrylates; diethyl maleate, dibutyl fumarate, and other diesters of dicarboxylic acids; styrene, α-methylstyrene, and other vinyl-group-containing aromatic compounds; vinyl acetate, and other vinyl-group-containing aliphatic compounds; butadiene, isoprene, and other conjugated diolefins; acrylonitrile, methacrylonitrile, and other nitrile-group-containing polymerizable compounds; vinyl chloride, vinylidene chloride, and other chlorine-containing polymerizable compounds; acrylamide, methacrylamide, and other amide-bond-containing polymerizable compounds. Each of these compounds can be used alone or in combination. Among them, n-butyl acrylate, benzyl methacrylate, and methyl methacrylate are specifically preferred. The content of the additional radical-polymerizable compounds in the alkali-soluble acrylic resin (B) is preferably less than 50% by weight and more preferably less than 40% by weight.

Polymerization solvents for use in the preparation of the alkali-soluble acrylic resin (B) include, but are not limited to, ethanol, diethylene glycol, and other alcohols; ethylene glycol monomethyl ether, diethylene glycol monomethyl ether, diethylene glycol ethyl methyl ether, and other alkyl ethers of polyhydric alcohols; ethylene glycol ethyl ether acetate, propylene glycol methyl ether acetate, and other alkyl ether acetates of polyhydric alcohols; toluene, xylene, and other aromatic hydrocarbons; acetone, methyl isobutyl ketone, and other ketones; ethyl acetate, butyl acetate, and other esters, of which alkyl ethers of polyhydric alcohols and alkyl ether acetates of polyhydric alcohols are preferred.

Polymerization catalysts for use in the preparation of the alkali-soluble acrylic resin (B) include conventional radical polymerization initiators such as 2,2'-azobisisobutyronitrile and other azo compounds; benzoyl peroxide, di-tert-butyl peroxide, and other organic peroxides.

The proportion of the ingredient (B) in the composition of the present invention is preferably 5 to 50 parts by weight, and more preferably 10 to 40 parts by weight, relative to 100 parts by weight of the ingredient (A). If the content is less than 5 parts by weight, the resulting composition may exhibit deteriorated resistance to plating solution and may cause loose parts and cracking of the resist film during plating operation. If it exceeds 50 parts by weight, the resulting resist film may exhibit deteriorated strength, may yield insufficiently sharp profile due to bulging and may exhibit deteriorated definition.

Quinonediazido-group-containing Compounds (C)

Quinonediazido-group-containing compounds for use as the ingredient (C) in the present invention include, but are not limited to, completely or partially esterified products or completely or partially amidated products of naphthoquinone-1,2-diazido-5-sulfonic acid, naphthoquinone-1,2-diazido-4-sulfonic acid, o-anthraquinonediazidosulfonic acid and other quinonediazido-group-containing sulfonic acids with other compounds. Such compounds include, but are not limited to, (I) 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5',6-hexahydroxybenzophenone, 2,3,3',4,4',5'-hexahydroxybenzophenone, and other polyhydroxybenzophenones; (II) bis(2,4-dihydroxyphenyl) methane, bis(2,3,4-trihydroxyphenyl)methane, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-[2-(4-hydroxyphenyl)-2-propyl]phenyl] ethylidene}bisphenol, 3,3'-dimethyl-{1-[4-[2-(3-methyl-4-hydroxyphenyl)-2-propyl]phenyl]ethylidene}bisphenol, and other bis[(poly)hydroxyphenyl]alkanes; (III) tris (4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis (4-hydroxy-3,5-dimethyphenyl)-2-hydroxyphenylmethane, bis (4-hydroxy-2,5-dimethylphenyl)-2-hydroxyphenylmethane, bis (4-hydroxy-2,5-dimethylphenyl)-3,4-dihydroxyphenylmethane, bis (4-hydroxy-3,5-dimethylphenyl)-3,4-dihydroxyphenylmethane, and other tris(hydroxyphenyl) methanes or methyl-substituted products of these compounds; (IV) bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis (5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis (3-cyclohexyl-2-hydroxyphenyl)-3-hydroxyphenylmethane, bis(5-cyclohexyl-4-hydroxy-3-methylphenyl)-4-hydroxyphenylmethane, bis (5-cyclohexyl-4-hydroxy-3-methylphenyl)-3-hydroxyphenylmethane, bis (5-cyclohexyl-4-hydroxy-3-methylphenyl)-2-hydroxyphenylmethane, bis (3-cyclohexyl-2-hydroxyphenyl)-4-hydroxyphenylmethane, bis(3-cyclohexyl-2-hydroxyphenyl)-2-hydroxyphenylmethane, bis(5-cyclohexyl-2-hydroxy-4-methylphenyl)-2-hydroxyphenylmethane, bis(5-cyclohexyl-2-hydroxy-4-methylphenyl)-4-hydroxyphenylmethane, and other bis (cyclohexylhydroxyphenyl)(hydroxyphenyl)methanes and methyl-substituted products thereof; (V) phenol, p-methoxyphenol, dimethylphenol, hydroquinone, naphthol, pyrocatechol, pyrogallol, pyrogallol monomethyl ether, pyrogallol-1,3-dimethyl ether, gallic acid, aniline, p-aminodiphenylamine, 4,4',-diaminobenzophenone, and other compounds having a hydroxyl group or an amino group; and (VI) novolak resins, pyrogallol-acetone resins, and p-hydroxystyrene homopolymers, or copolymers of monomers copolymerizable with p-hydroxystyrene.

Among these compounds, preferred are quinonediazidosulfonyl esters of compounds represented by following Formula (1) or (2):

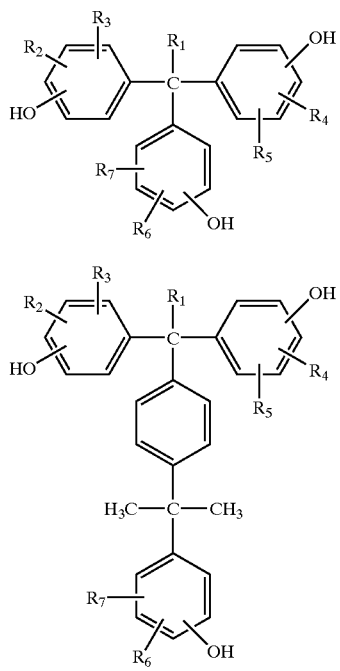

wherein $R_1$, $R_2$, $R_3$, $R_4$, $R_5$, $R_6$ and $R_7$ are each independently a hydrogen atom, a substituted or unsubstituted alkyl group having 1 to 5 carbon atoms or a substituted or unsubstituted cycloalkyl group having 4 to 8 carbon atoms.

Among these quinonediazidosulfonyl esters of the compounds represented by Formula (1) or (2), quinonediazidosulfonyl esters of a compound represented by following Formula (2a) are typically preferred.

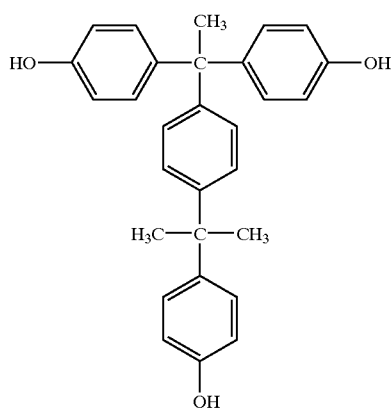

The sulfonyl moiety of the naphthoquinone-1,2-diazidosulfonyl group is preferably substituted at the 4- or 5-position of the compounds represented by Formula (1), (2) or the compound represented by Formula (2a). The resulting compounds are satisfactorily dissolved in solvents conventionally used for the preparation of solutions containing the resulting composition and have good compatibility with the film-forming substance, alkali-soluble novolak resin (A). When these compounds are used as photosensitizers of the positive photoresist composition, the resulting composition has high sensitivity, excellent image contrast and good sectional shape (profile), exhibits high thermal resistance and yields no foreign matter when used as a solution. Each of the quinonediazidosulfonyl esters of the compounds represented by Formula (1) or (2) can be used alone or in combination.

The compounds represented by Formula (1) can be prepared by condensing, for example, 1-hydroxy-4-[1,1-bis(4-hydroxyphenyl)ethyl]benzene with a naphthoquinone-1,2-diazidosulfonyl chloride in a solvent such as dioxane in the presence of an alkali such as triethanolamine, an alkali metal carbonate, or an alkali metal hydrogencarbonate for complete or partial esterification. Likewise, the compounds represented by Formula (2) can be prepared by condensing, for example, 1-[1-(4-hydroxyphenyl)isopropyl]-4-[1,1-bis (4-hydroxyphenyl)ethyl]benzene with a naphthoquinone-1, 2-diazidosulfonyl chloride in a solvent such as dioxane in the presence of an alkali such as triethanolamine, an alkali metal carbonate, or an alkali metal hydrogencarbonate for complete or partial esterification.

Naphthoquinone-1,2-diazido-4-sulfonyl chloride and naphthoquinone-1,2-diazido-5-sulfonyl chloride are suitable as the naphthoquinone-1,2-diazidosulfonyl chloride just mentioned above.

The composition of the present invention may further comprise quinonediazido-group-containing compounds in addition to the quinonediazidosulfonyl esters of the compounds represented by Formula (1) or (2) within ranges not deteriorating the objects of the invention.

Where necessary, the composition of the present invention may further comprise conventional sensitizers within ranges not deteriorating the objects of the invention. Such sensitizers include, but are not limited to, 1-[1-(4-hydroxyphenyl)isopropyl]-4-[1,1-bis(4-hydroxyphenyl) ethyl]benzene, mercaptooxazole, mercaptobenzoxazole, mercaptooxazoline, mercaptobenzothiazole, benzoxazolinone, benzothiazolone, mercaptobenzimidazole, urazol, thiouracil, mercaptopyrimidine, imidazolone, and derivatives of these compounds.

Each of the quinonediazido-group-containing compounds as the ingredient (C) can be used alone or in combination in the composition of the present invention. The proportion of the ingredient (C) in the composition is preferably 5 to 100 parts by weight, and more preferably 10 to 50 parts by weight, relative to 100 parts by weight of the novolak resin (A). If the proportion is less than 5 parts by weight, images in exact accordance with the pattern may not be obtained. If it exceeds 100 parts by weight, the resulting resist may have deteriorated sensitivity.

The composition of the present invention is preferably used as a solution comprising the above-mentioned ingredients dissolved in an appropriate solvent.

Such solvents include, but are not limited to, ethylene glycol monomethyl ether, ethylene glycol monoethyl ether, ethylene glycol monopropyl ether, ethylene glycol monobutyl ether, and other ethylene glycol alkyl ethers; diethylene glycol dimethyl ether, diethylene glycol diethyl ether, diethylene glycol dipropyl ether, diethylene glycol dibutyl ether, and other diethylene glycol dialkyl ethers; methyl cellosolve acetate, ethyl cellosolve acetate, and other ethylene glycol alkyl ether acetates; propylene glycol monomethyl ether acetate, propylene glycol monoethyl ether acetate, propylene glycol monopropyl ether acetate, and other propylene glycol alkyl ether acetates; acetone, methyl ethyl ketone, cyclohexanone, methyl amyl ketone, and other ketones; toluene, xylene, and other aromatic hydrocarbons; dioxane, and other cyclic ethers; methyl 2-hydroxypropionate, ethyl 2-hydroxypropionate, ethyl 2-hydroxy-2-methylpropionate, ethyl ethoxyacetate, ethyl hydroxyacetate, methyl 2-hydroxy-3-methylbutanoate, 3-methoxybutyl acetate, 3-methyl-3-methoxybutyl acetate, ethyl formate, ethyl acetate, butyl acetate, methyl acetoacetate, ethyl acetoacetate, and other esters. Each of these solvents can be used alone or in combination.

In order to form films of at least 20 μm thick by spin coating the resultant positive photoresist composition, the solvent is preferably used in an amount that provides a solid matter concentration of less than or equal to 65% by weight. If the solid matter concentration exceeds 65% by weight, the composition may have so extremely poor a fluidity that it can be handled with difficulty and moreover makes it difficult to obtain uniform resist films by spin coating.

Optionally, the composition of the present invention may further comprise a surfactant to improve coating properties, defoaming properties, leveling properties and other properties. Such surfactants include, but are not limited to fluorine-containing surfactants commercially available under the trade names of BM-1000 and BM-1100 (available from BM Chemie GmbH); MEGAFAC F142D, MEGAFAC F172, MEGAFAC F173 and MEGAFAC F183 (available from Dainippon Ink & Chemicals, Incorporated); FLUORAD FC-135, FLUORAD FC-170C, FLUORAD FC-430 and FLUORAD FC-431 (available from Sumitomo 3M Limited); SURFRON S-112, SURFRON S-113, SURFRON S-131, SURFRON S-141 and SURFRON S-145 (available from Asahi Glass Co., Ltd.); SH-28PA, SH-190, SH-193, SZ-6032 and SF-8428 (available from Toray Silicone Co., Ltd.). The proportion of these surfactants is preferably less than or equal to 5 parts by weight relative to 100 parts by weight of the alkali-soluble novolak resin (A).

To improve adhesion to the substrate, the composition of the present invention may effectively comprise an adhesive aid such as a functional silane coupling agent. The term "functional silane coupling agent" as used herein means and includes silane coupling agents each having a reactive substituent such as a carboxyl group, a methacryloyl group, an isocyanate group, or an epoxy group. Such functional silane coupling agents include, but are not limited to, trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, and β-(3,4-epoxycyclohexyl)ethyltrimethoxysilane. The proportion of the adhesive aid is preferably less than or equal to 20 parts by weight relative to 100 parts by weight of the alkali-soluble novolak resin (A).

To finely adjust the solubility to an alkali developing solution, the composition of the present invention may comprise an acid or anhydrous acid and/or a high boiling solvent. Such acids or anhydrous acids include, but are not limited to, acetic acid, propionic acid, n-butyric acid, iso-butyric acid, n-valeric acid, iso-valeric acid, benzoic acid and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid and syringic acid; polyhydric carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentatetracarboxylic acid, butanetetracarboxylic acid and 1,2,5,8-napthalenetetracarboxylic acid; and acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, himic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol anhydrotrimellitate and glycerol trisanhydrotrimellitate. Such high boiling solvents include, but are not limited to, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate. The amount of such a substance is not specifically limited and may be adjusted in accordance with purposes and coating processes of the resulting composition, as long as the composition can be uniformly mixed. In general, the amount of the substance is preferably less than or equal to 60% by weight, and more preferably less than or equal to 40% by weight, based on the weight of the resulting composition.

The composition of the present invention may further comprise other additives such as a filler, a coloring agent and a viscosity modifier according to necessity. Such fillers include, but are not limited to, silica, alumina, talc, bentonite, zirconium silicate and powdered glass. The coloring agent includes, but is not limited to, extender pigments such as alumina white, clay, barium carbonate and barium sulfate; inorganic pigments such as zinc white, white lead, chrome yellow, red lead, ultramarine blue, iron blue, titanium oxide, zinc chromate, red iron oxide and carbon black; organic pigments such as Brilliant Carmine 6B, Permanent Red 6B, Permanent Red R, Benzidine Yellow, Phthalocyanine Blue and Phthalocyanine Green; basic dyes such as magenta and rhodamine; direct dyes such as Direct Scarlet and Direct Orange; and acid dyes such as Rhocerin and Metanil Yellow. The viscosity modifier includes, for example, bentonite, silica gel and powdered aluminum. These additives may be used in such an amount that they do not deteriorate the essential properties of the composition, and preferably less than or equal to 50% by weight based on the weight of the resulting composition.

The composition of the present invention may be prepared by only mixing and stirring the materials according to a conventional procedure when the filler and the pigment are not used. When the filler and the pigment are used, the materials may be dispersed and mixed by means of a dispersion machine such as a dissolver, a homogenizer or a three-roll mill, further optionally followed by filtration using a mesh filter or a membrane filter.

The composition of the present invention is suitable for the formation of thick films and can also be used in, for example, protective films formed when various substrates such as copper, chromium, iron and glass substrates are etched, and resists for semiconductor fabrication.

When the composition of the present invention is used as a photoresist film, the thickness thereof is 5 to 100 μm, preferably 5 to 40 μm, and more preferably 20 to 30 μm.

Using the composition of the present invention as a resist film, bumps can be formed in the following manner.

(1) Formation of Coating/Resist Film: A solution of the composition prepared as described above is coated on a substrate having a predetermined wiring pattern to a thickness of 5 to 100 μm and preferably 20 to 40 μm to form a coating, and the coating formed is heated (prebaked) to remove the solvent to form the desired resist film. To coat the composition on the substrate, a process such as spin coating, roll coating, screen printing or applicator coating may be employed. Prebaking conditions may differ depending on the types of the respective components in the composition, their mixing proportion and the coating layer thickness. Usually the prebaking may be carried out at 70° C. to 130° C., and preferably 80° C. to 120° C., for 2 to 60 minutes.

(2) Exposure to Radiant rays: The resist film thus formed is exposed to radiant rays such as ultraviolet rays or visible light rays of 300 to 500 nm in wavelength through a mask with a given pattern, to expose the resist film only at its wiring pattern areas on which bumps are to be formed. Such radiation sources include, for example, low-pressure mercury lamps, high-pressure mercury lamps, ultrahigh-pressure mercury lamps, metal halide lamps, and argon gas lasers. The radiant rays to which the resist film is exposed are, for example, ultraviolet rays, visible light rays, far ultraviolet rays, X-rays, and electron beams. Radiation dose may differ depending on the types of the respective components in the composition, their mixing proportion and the coating layer thickness. For example, when the ultrahigh-pressure mercury lamps are used, the radiation dose is 100 to 2000 mJ/cm$^2$.

(3) Development: After the exposure to radiant rays, the unexposed pattern is developed by dissolving and removing the exposed unnecessary areas, using an alkaline solution as a developing solution, to make only the radiation-unexposed areas remain. As the developing solution, an aqueous solution of a basic compound may be used; the basic compound including, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene, and 1,5-diazabicyclo[4.3.0]-5-nonane. An aqueous solution prepared by adding to the aqueous solution of any of these basic compounds a water-soluble organic solvent or a surface-active agent may also be used as the developing solution.

Development time may differ depending on the types of the respective components in the composition, their mixing proportion and the dried coating thickness of the composition. Usually the development may be carried out for 1 to 30 minutes, and may be carried out by any of dispensing development, dip development, puddle development and spray development. After the development, the substrate is rinsed with running water for 30 to 90 seconds, followed by air drying by means of an air gun or drying in an oven.

The plating process is not specifically limited, and any conventional plating processes can be used.

EXAMPLES

The present invention will be illustrated in further detail with reference to several examples and comparative examples below, which are not intended to limit the scope of the invention. All parts and percentages are by weight unless otherwise specified.

Synthesis Example 1

Synthesis of Alkali-soluble Novolak Resin (A)

Sixty parts of m-cresol was added to 40 parts of p-cresol, the resulting mixture was condensed with formaldehyde (as formalin) using an oxalic acid catalyst according to a conventional procedure and thereby yielded a cresol novolak resin. Low molecular weight fractions of the resin were removed by fractionation to yield a novolak resin having a weight average molecular weight of 15000 (novolak resin A).

Synthesis Example 2

Synthesis of Alkali-soluble Acrylic Resin (B)

The inside of a flask equipped with a stirrer, reflux condenser, thermometer and dropping funnel was replaced by nitrogen, and 200 g of propylene glycol methyl ether acetate as a solvent was charged into the flask, followed by stirring. Thereafter, the temperature of the solvent was raised to 80° C. Into the dropping funnel, 0.5 g of 2,2'-azobisisobutyronitrile as a polymerization catalyst, 130 g of 2-methoxyethyl acrylate, 50.0 g of benzyl methacrylate and 20.0 g of acrylic acid were charged, followed by stirring until the polymerization catalyst dissolved. The resulting solution was uniformly dropped into the flask over 3 hours and was allowed to react at 80° C. for further five hours. The reaction mixture was then cooled to room temperature and thereby yielded acrylic resin B1.

Example 1

In 150 parts of a solvent propylene glycol methyl ether acetate, 70 parts of the novolak resin A, 15 parts of the acrylic resin B1 and 15 parts of a photosensitizer (C), i.e., an esterification product of 1 mole of the compound represented by Formula (2a) with 2 moles of 1,2-naphthoquinonediazido-4-sulfonyl chloride, were dissolved, and the resulting solution was filtrated through a membrane filter 1.0 μm in pore size and thereby yielded a positive photoresist composition. The properties of this composition were determined as shown below. The results are shown in Table 1.

Example 2

A positive photoresist composition was prepared in the same manner as in Example 1, except that 70 parts of the novolak resin A, 20 parts of the acrylic resin B1 and 10 parts by weight of a photosensitizer (C), i.e., an esterification product of 1 mole of the compound represented by Formula (2a) with 2 moles of 1,2-naphthoquinonediazido-4-sulfonyl chloride, were used. The properties of this composition were determined as shown below. The results are shown in Table 1.

Example 3

A positive photoresist composition was prepared in the same manner as in Example 1, except that 60 parts of the novolak resin A, 20 parts of the acrylic resin B1 and 20 parts of a photosensitizer (C), i.e., an esterification product of 1 mole of the compound represented by Formula (2a) with 2 moles of 1,2-naphthoquinonediazido-4-sulfonyl chloride, were used. The properties of this composition were determined as shown below. The results are shown in Table 1.

Example 4

A positive photoresist composition was prepared in the same manner as in Example 1, except that 70 parts of the novolak resin A, 20 parts of the acrylic resin B1, and 10 parts by weight of a photosensitizer (C), i.e., an esterification product of 1 mole of the compound represented by the following formula with 2 moles of 1,2-naphthoquinonediazido-5-sulfonyl chloride, were used. The properties of this composition were determined as shown below. The results are shown in Table 1.

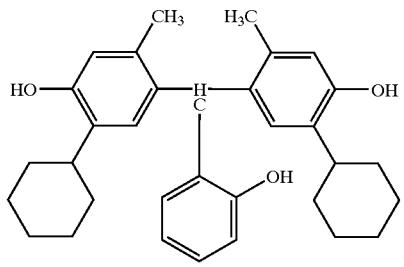

Comparative Example 1

An acrylic resin b1 was prepared in the same manner as in Synthesis Example 2, except that 0.5 g of 2,2'-azobisisobutyronitrile as a polymerization catalyst, 50.0 g of 2-methoxyethyl acrylate, 90.0 g of benzyl methacrylate and 60.0 g of 2-methacryloyloxyethyl hexahydrophthalate were used. A positive photoresist composition was prepared in the same manner as in Example 1, except that the acrylic resin b1 was used instead of the acrylic resin B1. The results are shown in Table 2.

Comparative Examples 2 to 4

Acrylic resins b2, b3 and b4 were prepared in the same manner as in Synthesis Example 2, except that the proportions of the components were changed as indicated in Table 3. Positive photoresist compositions were then prepared in the same manner as in Example 1, except that the acrylic resins b2 (Comparative Example 2), b3 (Comparative Example 3) and b4 (Comparative Example 4) were used instead of the acrylic resin B1, respectively.

Comparative Example 5

A positive photoresist composition was prepared in the same manner as in Example 1, except that the acrylic resin B1 was not used. The properties of the composition were determined as shown below. The results are shown in Table 2.

Comparative Example 6

A positive photoresist composition was prepared in the same manner as in Example 1, except that 15 parts of poly(vinyl ethyl ether) was used instead of the acrylic resin B1. The properties of the composition were determined as shown below. The results are shown in Table 2.

Determination of Properties
(i) Compatibility

A sample positive photoresist composition was stirred for 1 to 2 hours, and the state of the solution immediately after stirring and upon leaving for 1 to 2 hours after the completion of stirring was visually observed. How it stood as a dispersion was determined according to the following criteria:

Good: The composition was seen to have been uniformly dissolved immediately after stirring, and also seen to be in the uniformly dissolved state even after 1 to 2 hours.

Fair: The composition was seen to have been uniformly dissolved immediately after stirring, but seen to have caused phase separation after 1 to 2 hours.

Poor: The composition was not in the uniformly dissolved state even immediately after stirring.
(ii) Coating Properties The above positive photoresist composition used in the above test (i) was coated on a 5 inch gold-sputtered silicon wafer by means of a spinner at 1000 rpm for 25 seconds, and the coating formed was heated at 110° C. for 6 minutes on a hot plate. The surface of the dry film was visually observed to determine coating properties according to the following criteria:

Good: The film formed was free of unevenness and was uniform.

Poor: The film formed had unevenness such as pinholes and cissing.
(iii) Developing Properties and Definition The positive photoresist composition prepared in the above test (i) was coated on a 5 inch silicon wafer by means of a spinner at 1000 rpm for 25 seconds, and the coating formed was prebaked at 110° C. for 6 minutes on a hot plate and thereby yielded a coating about 20 μm thick. Next, through a patterned mask for measuring definition, the coating, which was formed on one sheet of coated substrate dividedly in three regions, was exposed to ultraviolet rays using ultrahigh mercury lamps (USH-250D, available from Ushio Inc.) at doses ranging from 500 mJ/cm$^2$ to 2000 mJ/cm$^2$, respectively. The substrate was then subjected to development using a developing solution (available from Tokyo Ohka Kogyo Co., Ltd. under the trade name of PMER Series P-7G). The resulting film was rinsed with running water, followed by nitrogen blowing to yield a patternwise cured product. This was observed on an optical microscope to determine the definition according to the following criteria:

Good: A hole pattern of 20 μm cubes had been resolved at any of the above exposure doses and no residue was observed.

Fair: A hole pattern of 20 μm cubes had been resolved at an exposure dose of equal to or more than 2000 mJ/cm$^2$ and no residue was observed.

Poor: A hole pattern of 20 μm cubes had not been resolved even at an exposure dose of equal to or more than 2000 mJ/cm$^2$ or any residue was observed.
(iv) Plating Solution Resistance The substrate having the patternwise cured product prepared in the above test (iii) was made into test materials. The test materials were subjected to ashing with oxygen plasma, was immersed in a non-cyanogen gold sulfite plating solution at 70° C. for 90 minutes, was then rinsed with running water and thereby yielded processed test materials. The processed test materials were observed on an optical microscope or a scanning electron microscope to examine how the patternwise cured product stood, to determine the shape of the bumps and the plating solution resistance of the patternwise cured product according to the following criteria:

Good: The bumps and the patternwise cured product showed no particular changes.

Poor: Cracks or deformation occurred in the patternwise cured product.
(v) Bump Shape Processed test materials were prepared in the same manner as in the test (iv) and were observed on an optical microscope or a scanning electron microscope to examine the shape of the bumps according to the following criteria:

Good: The shapes of the bumps were good and were in accordance with that of the patternwise cured product.

Poor: The shapes of the bumps were not in accordance with that of the patternwise cured product and induced bulging.
(vi) Releasability The substrates each carrying the patternwise cured product obtained in the test (iii) were used as test materials, were immersed in a releasing agent (acetone) at room temperature for 5 minutes with stirring, were rinsed with running water to thereby stripe the patternwise cured product. The resulting substrates were observed visually or on an optical microscope to examine the releasability of the patternwise cured product according to the following criteria:

Good: No residue of the patternwise cured product remained on the substrate.

Fair: The residue of the patternwise cured product remained on the substrate, but disappeared when the substrate was immersed in the releasing agent at elevated temperatures for 5 minutes.

Poor: The residue of the patternwise cured product remained on the substrate.

TABLE 1

|  | Example 1 | Example 2 | Example 3 | Example 4 |
|---|---|---|---|---|
| Compatibility | Good | Good | Good | Good |
| Coating Properties | Good | Good | Good | Good |
| Developing Properties and Definition | Good | Good | Good | Good |
| Plating Solution Resistance | Good | Good | Good | Good |
| Bump Shape | Good | Good | Good | Good |
| Releasability | Good | Good | Good | Good |

TABLE 2

|  | Com. Ex. 1 | Com. Ex. 2 | Com. Ex. 3 | Com. Ex. 4 | Com. Ex. 5 | Com. Ex. 6 |
|---|---|---|---|---|---|---|
| Compatibility | Good | Poor | Good | Good | Good | Good |
| Coating properties | Good | — | Good | Good | Good | Good |
| Developing properties and definition | Good | — | Poor | Poor | Fair | Good |
| Plating solution resistance | Poor (crack) | — | — | — | Poor (crack) | Good |
| Bump shape | Good | — | — | — | Good | Poor |
| Releasability | Good | — | — | — | Good | Fair |

Note: The symbol "—" means that the property in question could not be determined.

TABLE 3

|  | Syn. Ex. 1 | Com. Ex. 1 | Com. Ex. 2 | Com. Ex. 3 | Com. Ex. 4 |
|---|---|---|---|---|---|
| Reaction temperature (° C.) | 80 | 80 | 80 | 80 | 80 |
| Propylene glycol methyl ether acetate | 200 | 200 | 200 | 200 | 200 |
| Azobisisobutyronitrile | 0.5 | 0.5 | 0.5 | 0.5 | 0.5 |
| 2-Methoxyethyl acrylate | 130 (65) | 50 (25) | 190 (95) | 190 (85) | 90 (45) |
| Methoxytriethylene glycol acrylate | — | — | — | 28 (14) | — |
| Benzyl methacrylate | 50 (25) | 90 (45) | — | — | — |
| Acrylic acid | 20 (10) | — | 10 (5) | — | — |
| 2-Methacryloyloxyethyl hexahydrophthalate | — | 60 (30) | — | 2 (1) | 110 (55) |

TABLE 3-continued

|  | Syn. Ex. 1 | Com. Ex. 1 | Com. Ex. 2 | Com. Ex. 3 | Com. Ex. 4 |
|---|---|---|---|---|---|
| Weight average molecular weight | 250000 | 250000 | 250000 | 250000 | 250000 |

Note: The figures in the parentheses are percentages by weight of the polymerizable compound in the ingredient (B).
Note: The amounts of the ingredients are indicated by grams.

Other embodiments and variations will be obvious to those skilled in the art, and this invention is not to be limited to the specific matters stated above.

What is claimed is:

1. A positive photoresist composition for the formation of a thick film 5 to 100 μm thick, the composition comprising:
   an alkali-soluble novolak resin (A);
   an alkali-soluble acrylic resin (B); and
   a quinonediazido-group-containing compound (C);
   wherein the alkali-soluble acrylic resin (B) comprises:
      30% to 90% by weight of a constitutional unit (b1) derived from a polymerizable compound having an ether bond; and
      2% to 50% by weight of a constitutional unit (b2) derived from a polymerizable compound having a carboxyl group.

2. The composition according to claim 1, comprising:
   100 parts by weight of the alkali-soluble novolak resin (A);
   5 to 50 parts by weight of the alkali-soluble acrylic resin (B); and
   5 to 100 parts by weight of the quinonediazido-group-containing compound (C).

3. The composition according to claim 1, wherein the alkali-soluble acrylic resin (B) has a weight average molecular weight of 10000 to 800000.

4. The composition according to claim 1, wherein the quinonediazido-group-containing compound (C) comprises a quinonediazidosulfonyl ester of a compound represented by following Formula (1) or (2):

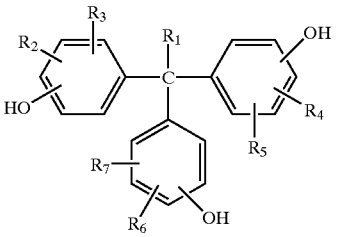

(1)

-continued

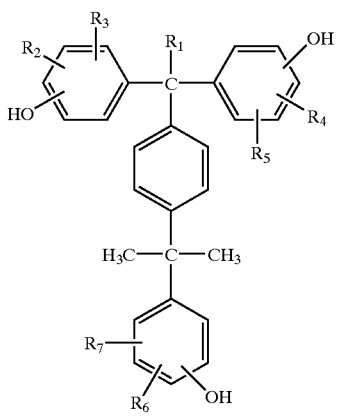

(2)

wherein $R_1$, $R_2$, $R_3$, $R_4$, $R_5$ $R_6$ and $R_7$ are each independently a hydrogen atom, a substituted or unsubstituted alkyl group having 1 to 5 carbon atoms or a substituted or unsubstituted cycloalkyl group having 4 to 8 carbon atoms.

5. A photoresist film being formed on a substrate by the application of the positive photoresist composition as claimed in any one of claims 1 to 4 and having a thickness of 5 to 100 μm.

6. A method of forming bumps, the method comprising the steps of:

applying the positive photoresist composition as claimed in any one of claims 1 to 4 on a substrate of an electronic part to thereby form a resist film as a coating;

irradiating the resist film with active light or radiant ray through a mask having a predetermined pattern;

developing the exposed resist film; and plating the portions from which the resist film has been removed.

* * * * *